United States Patent [19]

Matsutani

[11] Patent Number: 5,143,866
[45] Date of Patent: Sep. 1, 1992

[54] DRY ETCHING METHOD FOR REFRACTORY METALS, REFRACTORY METAL SILICIDES, AND OTHER REFRACTORY METAL COMPOUNDS

[75] Inventor: Takeshi Matsutani, Machida, Japan

[73] Assignee: Fujitsu Limited, Kawasaki, Japan

[21] Appl. No.: 642,167

[22] Filed: Jan. 17, 1991

Related U.S. Application Data

[63] Continuation of Ser. No. 387,921, Aug. 1, 1989, abandoned.

[30] Foreign Application Priority Data

Aug. 6, 1988 [JP] Japan .................. 63-196785

[51] Int. Cl.⁵ ............ H01L 21/00; H01L 21/02; H01L 21/205; H01L 21/263
[52] U.S. Cl. .................. 437/187; 437/192; 437/200; 437/245; 148/DIG. 147; 156/643; 156/656
[58] Field of Search ......... 437/108, 187, 192, 200, 437/201, 225, 228, 233, 245; 148/DIG. 57, DIG. 147

[56] References Cited

U.S. PATENT DOCUMENTS

| 4,183,780 | 1/1980 | McKenna et al. .......... 156/643 |
| 4,349,408 | 9/1982 | Tang et al. .......... 156/656 |
| 4,529,475 | 7/1985 | Okano et al. .......... 204/192.34 |
| 4,579,623 | 4/1986 | Suzuki et al. .......... 156/643 |
| 4,617,087 | 10/1986 | Iyer et al. .......... 156/643 |
| 4,713,141 | 12/1987 | Tsang .......... 156/643 |

FOREIGN PATENT DOCUMENTS

| 0127188 | 12/1984 | European Pat. Off. . |
| 0127268 | 12/1984 | European Pat. Off. . |
| 0175561 | 3/1986 | European Pat. Off. . |
| 0224313 | 10/1986 | Japan . |

OTHER PUBLICATIONS

Chow, T., Plasma Etching of Refractory Gates for VLSI Applications, Journ. of Electrochem. Soc., vol. 131, No. 10, (1984), pp. 2326-2335.
Degenkolb, Selective Dry Etching of Tungsten for VLSI Metallization, Journ. of Electrochem. Soc., vol. 85, No. 1, 1985, p. 353.

Primary Examiner—Brian E. Hearn
Assistant Examiner—B. Everhart
Attorney, Agent, or Firm—Armstrong & Kubovcik

[57] ABSTRACT

A dry etching method for refractory metal or its compound uses a mixed gas of an etchant gas for etching said refractory metal and a deposit gas for depositing said refractory metal. Halide of the etched refractory metal is used as the deposit gas. By using such a mixed gas, the refractory metal is etched at a portion where ion assist is strong, while the refractory metal is deposited at a portion where the ion assist is weak. In the dry etching, the ion mostly hits the surface of the object facing against the anode and hence the ion assist is strong, while the ion assist is weak at the side wall. Accordingly, the refractory metal is etched at the bottom surface of an etched groove, but at the side wall of the groove the refractory metal is deposited. This deposited metal protects the side wall from side etching. Therefore a fine pattern having a high aspect ratio etching is achieved.

16 Claims, 1 Drawing Sheet

2000 Å

DRY ETCHING METHOD FOR REFRACTORY METALS, REFRACTORY METAL SILICIDES, AND OTHER REFRACTORY METAL COMPOUNDS

This application is a continuation of application Ser. No. 387,921 filed Aug. 1, 1989, abandoned.

BACKGROUND OF THE INVENTION

1. Field of the Invention

The present invention relates to a dry etching method which is especially applicable for etching refractory metals or their compounds to form a pattern having a high aspect ratio.

In semiconductor industry, dry etching is widely used in various steps for fabricating various kinds of semiconductor devices. Recently, refractory metals such as tungsten (W), molybdenum (Mo) and titanium (Ti) or their silicides are coming to be used as electrodes or wirings of the devices, as the requirements for low resistivity and high temperature durability of the wirings increases. Since the packing density of the devices in integrated circuits (IC) is increasing, fine patterning of the wiring layer became essential. And an accurate etching of refractory metal patterns having a high aspect ratio is becoming important in the semiconductor industry.

2. Description of the Related Art

There are a variety of etching methods used in the semiconductor industry, such as plasma discharge etching, reactive ion etching (RIE), magnetically enhanced RIE, electron cyclotron resonance (ECR) etching, and so on. These etching methods were mainly developed for etching semiconductor materials, aluminum, dielectric materials such as silicon dioxide or photoresist films, and they are used in various processes for fabricating semiconductor devices utilizing respective etching features. These etching methods can also be applied for etching the refractory metals and their compounds which have a very high melting point. But some problems arise when they are applied for forming fine patterns of a wiring layer which is essential in recent semiconductor devices.

FIG. 1 shows a cross sectional view of an exemplary wiring used in ordinary semiconductor devices. In the figure, reference numeral 1 designates a substrate in which various semiconductor devices such as transistors or diodes (not shown) are fabricated. Insulating layer 2 is made of silicon dioxide ($SiO_2$) for example, which covers the substrate 1 and thus insulates the substrate 1 from the wirings formed on it. Over the insulating layer 2 is formed a wiring layer which is made from a refractory metal, tungsten for example. In some cases they are formed by a silicide or compound of the refractory metal. The wiring layer is etched to form a wiring 3.

In order to form the wiring 3, the entire surface of the wiring layer is coated with a $SiO_2$ layer 4 which is etched to form a wiring pattern by photolithography. The reference numeral 5 designates a photoresist pattern used for the photolithographic etching. FIG. 1 shows a state when the photoresist pattern 5 (shown by a broken line) is removed. Using the $SiO_2$ pattern 4 as a mask, the wiring layer is etched to form the wiring 3. In some cases, the photoresist pattern 5 is left unremoved, and used as a mask for etching the wiring pattern 3. In ordinary etching processes, the etching is done in both the vertical and lateral direction. So, an undercut 6 appears on both sides of the pattern. As a result the width of the wiring pattern 3 becomes narrower than the width of the mask. In order to accomplish a fine pattern etching, such side etching must be avoided, because it reduces the preciseness of the pattern or requires unwanted spaces for the wirings. These are all undesirable for recent fine patterned devices or high packing density circuits.

Various methods are proposed to overcome such undercutting. One is to perform the etching at a lower gas pressure, for example few m Torr, which is hundreds of times lower than ordinary etching pressure. In such a low pressure environment, the mean free path of the ions becomes long, and the ions hit the surface of the target along the electric lines of force which are perpendicular to the surface of the target. So, etching proceeds vertically to the surface of the target.

Another method is to increase the bias voltage applied to the target. A similar effect is obtained, and undercutting can be avoided for aluminum wirings. But when such methods are applied to refractory metals, the etching rate is decreased especially in the former method. While in the latter method, the layer beneath the etched layer is damaged and undesirable defects appear for fine patterned devices.

On the other hand, an etching method for high melting point metals such as W has been investigated, and it has been found that $SF_6$ is effective in increasing the etching efficiency of W. Further detail can be seen in for example, Japanese Laid Open Pat. No. 61-48924, published on Mar. 10, 1986 "Dry Etching Method for High Melting Point Metals" by S. Adachi et al. But more or less undercut was inevitable for wirings made of refractory metals or compounds thereof.

Recently, considerable improvements have been made in the reduction of side etching in the dry etching process. It has been found that side etching is remarkably prevented if silicon tetrachloride ($SiCl_4$) is used for etching silicon. This is considered due to the fact that, silicon is released from $SiCl_4$ by the plasma, and the released silicon is deposited on the side wall of the etched groove and protects the side wall from the side etching. Further detail can be seen in "Trench Etching of Silicon by Hex Reactor" by G. K. Herb et al., Solid State Technology, December, 1987 (Edition translated in Japanese). But such an etching method can not be applied for refractory metals.

Further, an attempt has been proposed to use a masking material including $SF_6$ to form a protection layer on the side wall of the etched groove formed in tungsten film to protect it from the side etching. Details of such a method is described in "ANISOTROPIC ETCHING OF TUNGSTEN" by T. Saito et al, pp. 240–249, Spring Meeting of ECS (Electro Chemical Society) 1988, held in Atlanta U.S.A. In this method, there is a danger that the released sulfur (S) might contaminate the surface of the device, and stain the etching apparatus.

These attempts are still under development, and there is no remarkable dry etching method which is applicable for refractory metals or their compounds, and which prevents side etching of grooves or undercutting of patterns beneath the mask.

SUMMARY OF THE INVENTION

The object of the present invention, therefore, is to provide a dry etching method for refractory metals or their compounds, which suppresses side etching.

Another object of the present invention is to provide a dry etching method for forming fine patterns for wirings or electrodes of semiconductor devices using refractory metals or their compounds.

A further object of the present invention is to provide a dry etching method for refractory metals or their compounds which is applicable to ordinary dry etching apparatus.

In the etching method of the present invention, two kinds of gas are mixed and led into an etching chamber. One is an etching gas for etching the refractory metal or its compounds, another one is a deposit gas which deposits refractory metals. Namely, an etchant gas such as sulfur hexafluoride ($SF_6$) and a deposit gas such as a halide of refractory metals, tungsten hexafluoride $WF_6$ for example, are mixed together, and are fed to a dry etching chamber.

The mixing of these gases seems to be self-contradictory, but it is found that by choosing a proper mixing ratio, the deposited refractory metal can stick only on the side wall of the etched groove, and can not be deposited on the bottom surface of the etched groove. The deposited refractory metal protects the side wall from side etching. As a result, the etching proceeds vertically downward from the surface of the substrate without side etching. Therefore, a sharp etching of high aspect ratio was achieved for refractory metals and their compounds.

Applying such a mixed gas to ordinary dry etching methods, such as RIE, magnetic field enhanced RIE, cyclotron resonance etching and so on, the dry etching of refractory metals or their compounds can be easily done without side etching. There is no need to use special equipment.

Further objects and advantages of the present invention will be apparent from the following description, reference being had to the accompanying drawings wherein preferred embodiments of the present invention are clearly shown.

BRIEF DESCRIPTION OF THE DRAWINGS

Throughout the drawings, same or like reference numerals designate and identify the same or similar parts.

DESCRIPTION OF THE PREFERRED EMBODIMENTS

As has been described before, there is no proper etchant gas for refractory metal, which protects the side walls of the etched grooves from side etching while the gas is performing a dry etching. The inventor tried to mix an etchant gas with a deposit gas which deposits the refractory metal. A halide of the refractory metal which is to be etched off was chosen as the deposit gas to be mixed with the etchant gas. At first sight, this idea appears contradictory in an etching process for the refractory metal. Namely, in order to dry etch tungsten for example, an etchant gas $SF_6$ is mixed with tungsten hexafluoride ($WF_6$) which deposits tungsten. The latter gases are often used for depositing tungsten in CVD processes etc.

Figure 2:
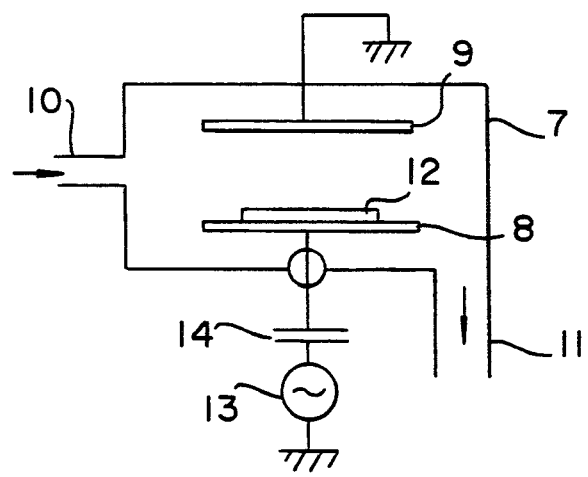
FIG. 2 is a conceptional drawing of a reactional ion etching device, to which the present invention is applicable.

FIG. 2 is a conceptional drawing of a conventional reactional ion etching device which can be used for the dry etching process of the present invention. In an etching chamber 7 are provided a cathode 8 and an anode 9 facing each other. A mixture of the etchant gas and the deposit gas is fed into the etching chamber 7 through an inlet pipe 10, and exhausted from an exhaust pipe 11. On the cathode 8 is positioned an object 12 to be etched. The gas pressure in the etching chamber 7 is kept at a desired level (0.2-0.3 Torr for example) by controlling the flow rate of the gas fed into the etching chamber 7 through the inlet pipe 10 and the pumping speed of an exhaust pump (not shown). A high frequency power is fed from a radio frequency (RF) generator 13 to the cathode 8 via a capacitor 14, while the anode 9 is grounded. All of these devices and their controls are conventional ones for ordinary dry etching processes. Further description, therefore, is omitted for the sake of simplicity.

In an embodiment using ordinary RIE equipment, a mixed gas of $SF_6$ with a flow rate of 50 SCCM (standard cubic centimeter per minute) as an etchant gas, and $WF_6$ with a flow rate of 15-20 SCCM as a deposit gas were fed into the etching chamber, and the pressure in the chamber was kept at 0.2-0.3 Torr. RF power of 13.56 MHz was fed to the cathode with a power level of 1.5 watt/cm$^2$. Under such conditions, no side etching was found in an etched tungsten film.

A patterning test has been carried out with a 2,500 Å thick tungsten film which is deposited by sputtering on a 100 Å thick silicon dioxide ($SiO_2$) layer on a silicon substrate. A photo resist mask of 1.2 μm thickness and 0.8 μm width, was formed over the entire surface of the tungsten film by photolithography. Using the above dry etching conditions, the etching speed was 1,300 Å/min. The width of the obtained tungsten pattern was 0.8 μm. This means that the tungsten film was etched without undercut. This was also ascertained by microscopic cross sectional observation On the other hand, if the deposit gas of $WF_6$ was omitted, the tungsten film was undercut and the width of the pattern was reduced to 0.3 μm. Therefore, the effect of mixing the deposit gas is apparent.

The etching rate for other materials such as $SiO_2$ is found to be very slow. For example, the etching rate for $SiO_2$ is 160 Å/min, which is eight times as slow as that of tungsten. Since the etching rate for $SiO_2$ is slow, the wiring pattern can be perfectly etched without the fear of damaging the substrate by over etching. Therefore, it is easy to obtain a uniform pattern over the entire surface of the substrate. This fact is very important for manufacturing of the semiconductor devices.

Figure 1:
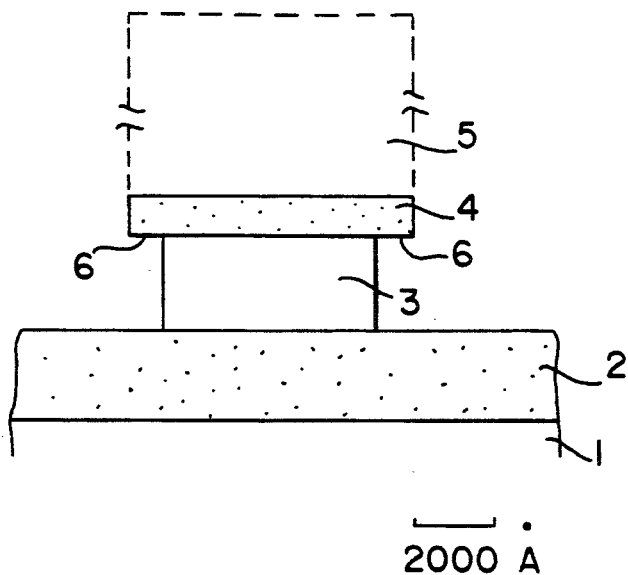
FIG. 1 shows schematically a cross sectional view of an exemplary wiring used in ordinary semiconductor devices.
Figure 3:
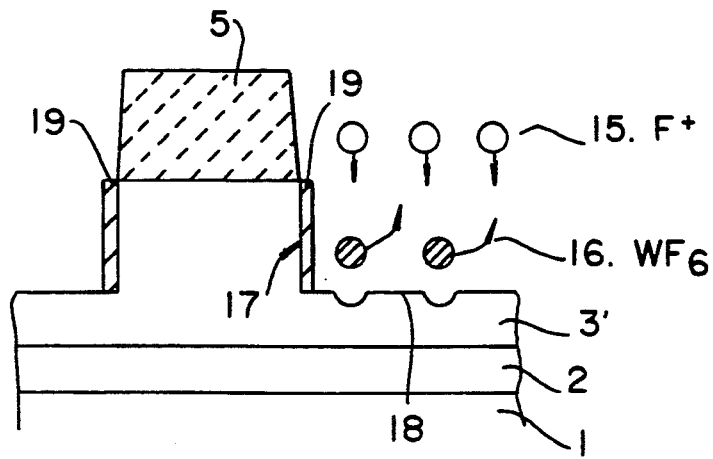
FIG. 3 is a schematic diagram to illustrate the principle of the etching mechanism of the present invention.

The reason why side etching is avoided by the present invention is believed to be as follows. FIG. 3 is a schematic cross section of a portion of a substrate where etching is being performed. FIG. 3 corresponds to FIG. 1. Namely, 1 is a substrate which is made of silicon for example, 2 is an insulation layer made of $SiO_2$, for example, covering the surface of the substrate 1, 3' is a wiring layer of refractory metals, tungsten for example, and 5 is a photoresist film which is etched by photolithography to form a predetermined wiring pattern. When such a substrate is processed in a RIE etching chamber like FIG. 2 for example, the etchant gas SF$_6$ is ionized by the RF power, and generates F$^{30}$ ions 15, which hit the surface of the wiring layer 3' causing a chemical compound WF$_6$ 16 to be formed, which is a volatile compound and easily removed by ion bombardment. This is a mechanism of RIE, and the rejection of chemically combined compounds by ion bombardment is called "ion assist" in the art.

The removed chemical compound WF$_6$ is exhausted by the pump, and dry etching proceeds in such a manner. But precisely speaking, some of the volatilized WF$_6$ 16 is ionized again by the RF power, and released W which is deposited on various parts in the etching chamber. The released W deposits again also on the wiring layer 3', but the effect of the ion assist is higher than the deposition of W, and as a result the etching proceeds. As mentioned before WF$_6$ is a deposition gas which is used in CVD for depositing tungsten. What happens if WF$_6$ is intentionally added in the etching chamber? There must be a critical pressure of WF$_6$ at which the etching and deposition are balanced to each other. If the pressure of WF$_6$ is lower than the critical pressure, the etching will proceed, while if the pressure is higher than the critical pressure, the deposition of tungsten will dominate. The critical pressure depends on the degree of the ion assist. The stronger the ion assist, the higher the critical pressure becomes. The ion assist is strongest on the surface of the wiring layer 3' which is exposed from the photoresist film 5, especially on the horizontal surface 18 of the wiring layer which is facing against the anode 9 (FIG. 2) of the etching device. On the side wall 17 of the etched groove, the ion assist is less stronger than on the horizontal surface 18, that is a bottom face of groove. Therefore, if the pressure of WF$_6$ is kept properly, the etching on the bottom face 18 of the groove will proceed, while on the side walls 17 of the etched groove, the tungsten will be deposited or the etching and the deposition are balanced. And the deposited tungsten will form a protection layer 19 which protects the side walls from side etching. This is the fundamental consideration of the invention. For the etchant gas, other kinds of gases such as carbon tetrafluoride (CF$_4$), carbon hydro-trifluoride (CHF$_3$), for example, are applicable.

Once the above explanation has been understood with respect to etching a tungsten film with a mixed gas of SF$_6$ and WF$_6$, it now becomes easy to extend the principle of the present invention to the etching of some other materials. The fundamental principle is to mix an etchant gas and a deposit gas of the etched material, and keep a proper partial pressure of the deposit gas in the dry etching chamber for etching the portion where ion assist is strong (the bottom face of the etched groove), while depositing the etched material or the deposition and the etching of the etched material are balanced on the portion where ion assist is weak (side wall of the etched groove).

The following table is a summary of the preferable deposit gases to be mixed with an etchant gas for etching various refractory metals and their compounds. The etchant gas may be SF$_6$, CF$_4$ or CHF$_3$ etc. These etchant gases include halogen atoms in their molecules.

| Materials to be etched | deposit gas |
| --- | --- |
| W | WF$_6$ |
| WSi$_x$ | WF$_6$ |
| WN | WF$_6$ |
| Mo | MoF$_6$ |
| MoSi$_x$ | MoF$_6$ |
| Ti | TiCl$_4$ |
| TiSi$_x$ | TiCl$_4$ |
| TiN | TiCl$_4$ |
| TiW | WF$_6$, or TiCl$_4$ |

These gases were selected from the fact that their vapor pressure is in a preferable range, 0.2–0.3 Torr for example, for performing the dry etching. The partial pressure of these gases in the etching chamber depends on the equipment used for dry etching, frequency and power of the applied radio frequency, shape of the object and so on. Therefore, it must be determined for each device and object. Generally, the partial pressure of the deposit gas was about 15–30% of the total pressure of the gases in the etching chamber.

The above description of the etching method of the present invention has been explained with respect to a reactive ion etching, but it can be applied for any other types of dry etching methods such as magnetically enhanced RIE, electron cyclotron resonance (ECR) etching, and so on, and there is no need to use any special equipment or device for applying the invention. By applying the present invention, it becomes possible to dry etch refractory metals or their compounds without suffering from side etching, and achieve an etched pattern having a high aspect ratio.

I claim:

1. A dry etching method for etching a refractory metal or a compound thereof by a plasma discharge in an etching chamber to form an etched pattern on a substrate, said etched pattern having a sidewall and a bottom surface in which the lateral etching on the sidewall is prevented, comprising the steps of:

mixing gases of an etchant gas for etching said refractory metal and a deposit gas for depositing said refractory metal, keeping a mixing rate of said etchant gas and deposit gas so as to balance the etching and the deposition of refractory metal, while maintaining a partial pressure of said deposit gas in a range of 15 to 30 per cent of a total gas pressure in said etching chamber; and introducing a plasma discharge on said substrate in a direction to make ions impact vertically to the surface of said substrate.

2. A dry etching method as set forth in claim 1 wherein said dry etching method uses an ion assist which enhances the etching by ion bombardment, and a partial pressure of said deposit gas in said etching chamber is kept so that etching proceeds at portions where the ion assist is strong, while said refractory metal is deposited, or the deposition and etching of said refractory metal are balanced with each other, at portions where the ion assist is weak.

3. A dry etching method as set forth in claim 1 or 2, wherein said etchant gas comprises molecules containing halogen atoms.

4. A dry etching method as set forth in claim 1 or 2, wherein said deposit gas is a halide of said refractory metal.

5. A dry etching method as set forth in claim 3, wherein said halide of said refractory metal comprises one selected from WF$_6$, MoF$_6$, and TiCl$_4$.

6. A dry etching method as set forth in claim 3, wherein said refractory metal is tungsten (W), and said deposit gas comprises $WF_6$.

7. A dry etching method as set forth in claim 3, wherein said compound of said refractory metal is tungsten silicide ($WSi_x$), and said deposit gas comprises $WF_6$.

8. A dry etching method as set forth in claim 3, wherein said compound of said refractory metal is tungsten nitride (WN), and said deposit gas comprises $WF_6$.

9. A dry etching method as set forth in claim 3, wherein said refractory metal is molybdenum (Mo), and said deposit gas comprises $MoF_6$.

10. A dry etching method as set forth in claim 3, wherein said compound of said refractory metal is molybdenum silicide ($MoSi_x$), and said deposit gas comprises $MoF_6$.

11. A dry etching method as set forth in claim 3, wherein said refractory metal is titanium (Ti), and said deposit gas comprises $TiCl_4$.

12. A dry etching method as set forth in claim 3, wherein said compound of said refractory metal is titanium silicide ($TiSi_x$), and said deposit gas comprises $TiCl_4$.

13. A dry etching method as set forth in claim 3, wherein said compound of said refractory metal is titanium nitride (TiN), and said deposit gas comprises $TiCl_4$.

14. A dry etching method as set forth in claim 3, wherein said compound of said refractory metal is titanium tungsten compound (TiW), and said deposit gas comprises one selected from $WF_6$, and $TiCl_4$.

15. A dry etching method for etching a refractory metal or a compound thereof by a plasma discharge in an etching chamber to form an etched pattern on a substrate, said etched pattern having a sidewall and a bottom surface in which the lateral etching on the sidewall is prevented, comprising the steps of:

positioning an object to be etched in said etching chamber, said object comprising a metal layer of said refractory metal or compound thereof and having an insulating protective layer selectively positioned on top of said metal layer covering at least one area thereof, said metal layer being a substrate;

mixing gases to form a mixed gas and admitting said mixed gas into said etching chamber, said mixed gas comprising (a) an etchant gas for etching said metal layer to form at least one pattern having a sidewall and a bottom surface, and (b) a deposit gas for depositing said refractory metal or compound thereof onto said sidewall of said metal while said bottom surface is being etched, keeping a mixing rate of said etchant gas and deposit gas so as to balance the etching and the deposition of refractory metal, while maintaining a partial pressure of said deposit gas in a range of 15 to 30 per cent of a total gas pressure in said etching chamber; and introducing a plasma discharge on said substrate in a direction to maker ions impact vertically to the surface of said substrate.

16. A dry etching method for anisotropically etching a refractory metal or a compound thereof provided on a substrate to form an etched pattern having a side wall and a bottom surface in which the side wall is protected from etching while etching of the bottom surface takes place, using plasma containing ions directed in a predetermined direction relative to the substrate in an etching chamber, said method comprising the steps of:

adding a deposit gas for depositing a refractory metal on a side wall of an etched pattern of the refractory metal or a compound thereof layer, to an etchant gas for etching said refractory metal or a compound thereof from said bottom surface of said etched pattern insert here;

placing the substrate in the etching chamber so that the bottom surface of said etched pattern is perpendicular to the direction of said ions impinging thereon and consequently the side wall of the etched pattern is parallel to the direction of said impinging ions; and setting a ration of said etchant gas to said deposit gas so as to result in net etching of said refractory metal or compound thereof from said bottom surface of said etched pattern, and net deposition of said refractory metal on said side wall of said etched pattern.

* * * * *